United States Patent
Shah et al.

(10) Patent No.: US 9,143,057 B1
(45) Date of Patent: Sep. 22, 2015

(54) METHOD AND APPARATUS FOR CONTROLLING Q LOSSES THROUGH FORCE DISTRIBUTIONS

(71) Applicants: Ashish A. Shah, Lincoln, MA (US); Anthony D. Minervini, Palos Hills, IL (US)

(72) Inventors: Ashish A. Shah, Lincoln, MA (US); Anthony D. Minervini, Palos Hills, IL (US)

(73) Assignee: QUALTRE, INC., Marlborough, MA (US)

(*) Notice: Subject to any disclaimer, the term of this patent is extended or adjusted under 35 U.S.C. 154(b) by 0 days.

(21) Appl. No.: 13/965,811

(22) Filed: Aug. 13, 2013

Related U.S. Application Data

(60) Provisional application No. 61/832,220, filed on Jun. 7, 2013.

(51) Int. Cl.
| | |
|---|---|
| *G01L 1/00* | (2006.01) |
| *H02N 1/00* | (2006.01) |
| *B81B 3/00* | (2006.01) |
| *B81C 1/00* | (2006.01) |

(52) U.S. Cl.
CPC ............... *H02N 1/00* (2013.01); *B81B 3/0018* (2013.01); *B81C 1/00134* (2013.01)

(58) Field of Classification Search
CPC ............ B81C 1/00246; B81C 1/00301; B81C 1/00674; B81C 1/00888; B81C 2201/0176; G01L 9/0008; G01L 9/0042
USPC .................................. 73/760, 777, 862
See application file for complete search history.

(56) References Cited

U.S. PATENT DOCUMENTS

| | | | | |
|---|---|---|---|---|
| 6,942,750 | B2 * | 9/2005 | Chou et al. | 156/272.2 |
| 8,430,798 | B2 * | 4/2013 | Lan et al. | 482/84 |
| 2003/0160021 | A1 * | 8/2003 | Platt et al. | 216/2 |
| 2007/0103029 | A1 * | 5/2007 | Fedder et al. | 310/307 |

* cited by examiner

*Primary Examiner* — Max Noori
(74) *Attorney, Agent, or Firm* — Burns & Levinson LLP; Bruce D. Jobse

(57) ABSTRACT

A microelectromechanical (MEMS) package including a compressive system preferentially directs external forces, towards the MEMS sensor in a manner that affects several components of the Quality Factor (Q) of the MEMS system. Relatively rigid materials (force transfer elements) are added or deposited in strategic places along any of the edges, faces or corners of a MEMS sensor, followed by the addition of material, which by virtue of the annealing process, applies a compressive stress to all objects encased therein. As a result, vibrational modes are affected due to changes in the effective mass and spring constants of the total MEMS apparatus system, dampening particular modes and stabilizing the MEMS transducer since such modes cannot be spuriously activated due to environmental changes. By attenuating, or at least causing them to be constant, the spurious modes and their absorption of vibrational energy are predictable over all operating conditions and thus amenable to electronic controls, e.g., electrical compensation.

29 Claims, 7 Drawing Sheets

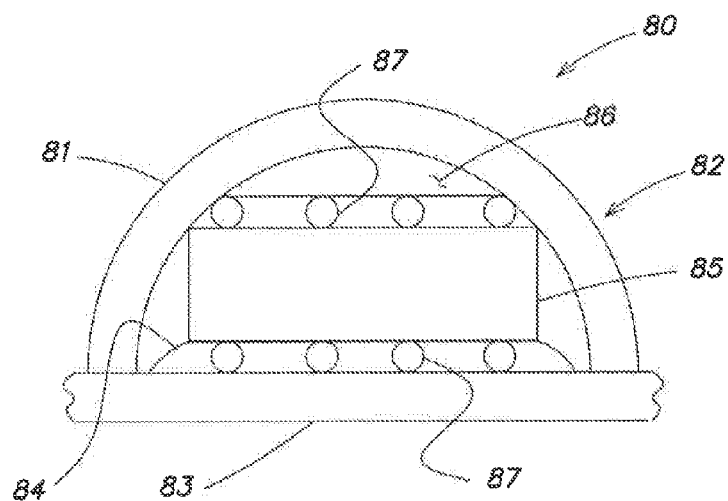
FIG. 8
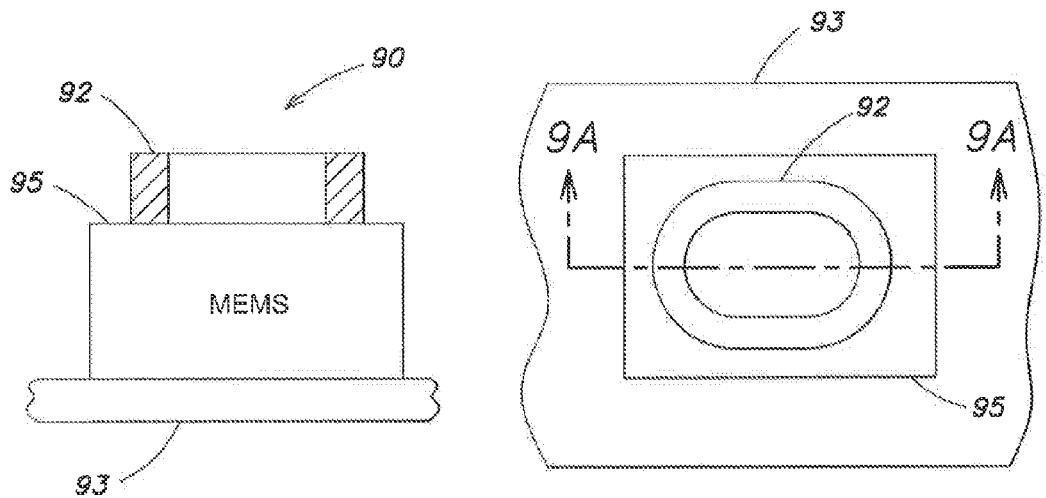
FIG. 9A
FIG. 9B

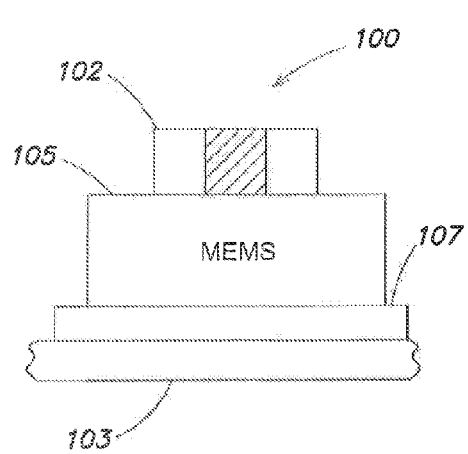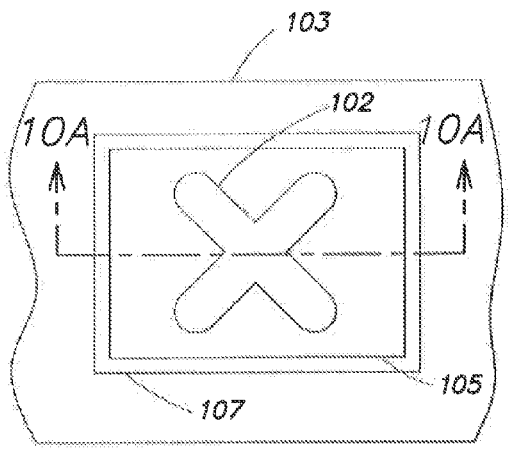
FIG. 10A  FIG. 10B
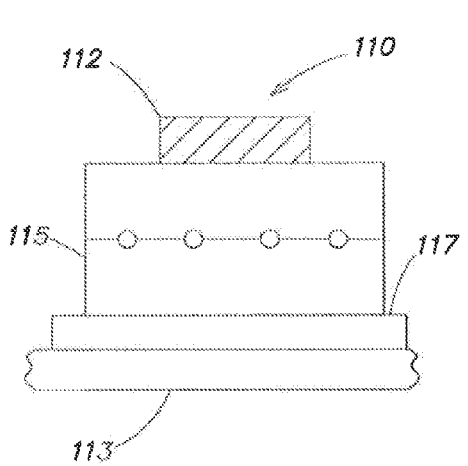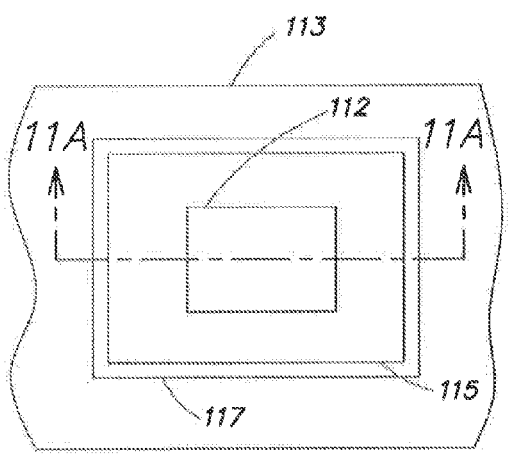
FIG. 11A  FIG. 11B

METHOD AND APPARATUS FOR CONTROLLING Q LOSSES THROUGH FORCE DISTRIBUTIONS

RELATED APPLICATIONS

This application claims priority to U.S. Provisional patent application Ser. No. 61/832,220, filed on Jun. 7, 2013, and entitled METHOD AND APPARATUS FOR CONTROLLING Q LOSSES THROUGH FORCE DISTRIBUTIONS, the subject matter of which is incorporated herein in its entirety by this reference for all purposes.

FIELD OF THE INVENTION

The disclosure relates to electronic circuits and components, and, more specifically, to a method and apparatus controlling Quality Factor (Q) losses in a MEMS transducer.

BACKGROUND

Typically, MEMS gyroscope packaging uses a conventional overmolded plastic package approach, sometimes with a ceramic substrate or sometimes with a circuit board type substrate. No special attention is paid to the distribution or focusing of forces (either mechanically or thermally induced) on the MEMS transducer.

Accordingly, a need exists to specifically "tune" these forces by focusing or distributing them accordingly in order to maximize immunity of the MEMS sensor to the externally applied forces due to the environment (thermal, vibration) or customer application/treatment.

SUMMARY

Disclosed herein are various embodiments of a microelectromechanical (MEMS) package which preferentially directs external forces, as a result of packaging materials and configurations, towards the MEMS sensor in a manner that affects several components of the Quality Factor (Q) of the MEMS system. Relatively rigid materials (force transfer elements) are added or deposited in strategic places along any of the edges, faces or corners of a MEMS sensor, followed by the addition of material, which by virtue of the annealing process, applies a compressive stress to all objects encased therein. As a result, vibrational modes are affected due to changes in the effective mass and spring constants of the total MEMS apparatus system, dampening particular modes and stabilizing the MEMS transducer since such modes cannot be spuriously activated due to environmental changes. By attenuating, or at least causing them to be constant, the spurious modes and their absorption of vibrational energy are predictable over all operating conditions of the MEMS transducer and thus amenable to electronic controls, e.g., electrical compensation.

According to one aspect of the disclosure, a microelectromechanical (MEMS) apparatus comprises: a MEMS transducer having plurality of exterior surfaces; and a compressive system mechanically coupled to at least one of the plurality of exterior surfaces. In one embodiment, the compressive system comprises a force distribution element and a force transfer element. In other embodiments, multiple force transfer for elements of various shapes and sizes are positioned about any of the sides, edges or corners of a MEMS transducer transducer to direct compressive forces to opposing exterior of the surfaces of the MEMS transducer. In other embodiments, the compressive system comprises a material having a higher coefficient of expansion at higher temperatures.

According to another aspect of the disclosure, a method of operating a microelectromechanical (MEMS) transducer comprises: A) providing a MEMS transducer having a plurality of exterior surfaces; and B) applying compressive force to at least one of the plurality of exterior surfaces of the MEMS transducer. In one embodiment, B) comprises compressive forces to opposing exterior of the surfaces of the MEMS transducer. In other embodiments, B) comprises applying greater compressive force to at least one of the plurality of exterior surfaces of the MEMS transducer when the MEMS transducer is operating at a higher temperature.

According to still another aspect of the disclosure, a microelectromechanical (MEMS) package apparatus comprises: a MEMS transducer having plurality of exterior surfaces; and a compressive system applying compressive force to opposing of the plurality of exterior surfaces.

In yet another aspect of the disclosure, a method of manufacturing a microelectromechanical (MEMS) transducer comprises: A) disposing a MEMS transducer having a plurality of exterior surfaces on a substrate; and B) constructing a compressive structure adjacent to and mechanically coupled with at least one of the plurality of exterior surfaces of the MEMS transducer. In one embodiment, B) comprises: B1) constructing the compressive structure from a rigid material having a higher coefficient of expansion at higher temperatures. In other embodiments, the compressive structure may be constructed using either an injection molding or material deposition process.

DESCRIPTION THE DRAWINGS

Embodiments of the disclosed subject matter are described in detail below with reference to the following drawings in which:

FIG. 8 is illustrates conceptually a partial cross-sectional view of a MEMS transducer in accordance with another embodiment of the present disclosure;

FIG. 9A illustrates conceptually a partial top view of a MEMS transducer in accordance with an embodiment of the present disclosure;

FIG. 9B illustrates conceptually a partial cross-sectional view of the MEMS transducer of FIG. 9A in accordance with an embodiment of the present disclosure;

FIG. 10A illustrates conceptually a partial top view of a MEMS transducer in accordance with an embodiment of the present disclosure;

FIG. 10B illustrates conceptually a partial cross-sectional view of the MEMS transducer of FIG. 10A in accordance with an embodiment of the present disclosure;

FIG. 11A illustrates conceptually top view of a MEMS transducer in accordance with an embodiment of the present disclosure; and FIG. 11B illustrates conceptually a partial cross-sectional view of the MEMS transducer of FIG. 11A in accordance with an embodiment of the present disclosure.

DETAILED DESCRIPTION

Figure 1:
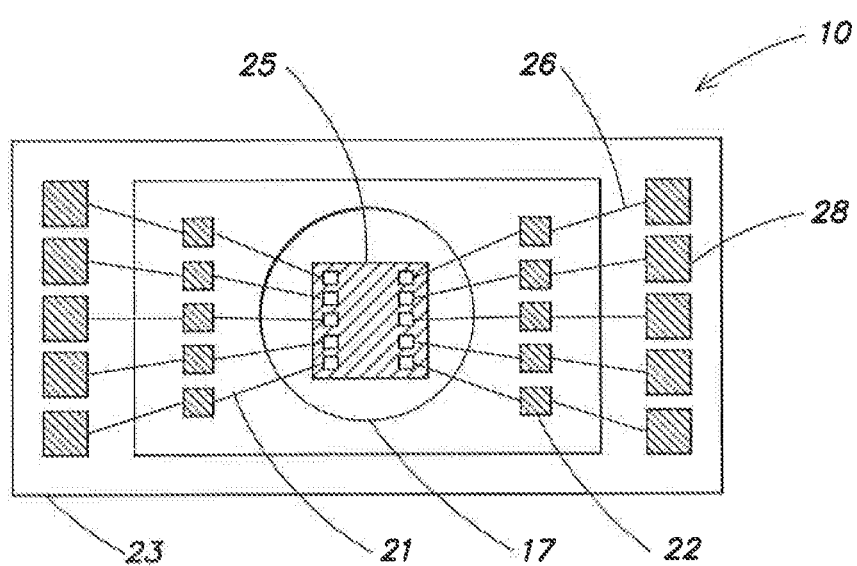
FIG. 1 illustrates conceptually a partial top view of a MEMS transducer in accordance with embodiments of the present disclosure.

The current art in MEMS gyroscope packaging does not teach that additional force transfer elements may be necessary to stabilize a sensor based on Bulk Acoustic Wave (BAW) technology, requiring matching of modes with high Q. This oversight is addressed with the methods and apparatus disclosed herein which enable the implementation of MEMS sensors that are stable over changing environmental conditions (temperature, stress, strain).

MEMS transducers, in particular capacitive transducers like gyroscopes, accelerometers, microphones, pressure sensors and combinations thereof, are susceptible to having their performance compromised by externally induced strains. This is due, in part, because there are typically very small air gaps, on the order of 100's of nanometers in BAW transducers, and micrometers in other transducers, that will change when the structures defining them are moved with respect to each other. The external strains may be introduced by a number of factors.

Capacitive based, MEMS sensors with sense air gaps on the order of 100's of nanometers, may also exhibit high sensitivity to vibrational and acoustic energy. These forms of energy may manifest in the form of noise that compromises the signal fidelity of the MEMS sensor. Additionally, MEMS sensors, whose operation involves the excitation of one member of the transducer e.g. an electrode, by electrical actuation, causing vibration, suffer the problem of preventing other portions of the sensor from also vibrating in phase with the member which is excited. When such a sensor is affixed to a substrate or other structure, such vibrations are controlled, so that signal integrity is not compromised, by suspending the MEMS sensor in a way that maximizes isolation of the vibrations, but still allow for robust electrical and mechanical connections to the package, housing or mounting structure.

Capacitive MEMS sensors using very small air gaps (~100 nanometers) may also be affected by small, rapid fluctuations in temperature on account of the small scale. Large, slow variations in temperature can typically be accommodated by electronic correction algorithms, however, smaller rapid fluctuations, akin to Brownian motion, may result in an apparent noise signal, which tends to compromise the performance of a BAW type sensor. Coating or covering the sensor with a material may attenuate the magnitude and hence effect of the thermal fluctuations at the critical structures of the MEMS sensor. However, without due care in material selection, the mechanical properties, e.g. Young's modulus and coefficient of thermal expansion, may induce other strains in the sensor when absorbing the thermal energy. This may result in degradation of transducer performance similar to that described above whereby stresses, strains and vibrations manifest as noise in the MEMS system and thus degrade the signal to noise ratio (or fidelity) of the transducer.

External sources of vibration may cause degradation of the MEMS transducer performance. Internal vibrations may also be a source of degradation. The vibration of the disc in a bulk acoustic wave MEMS transducer is complicated by the fact that other structures in the sensor (i.e. electrodes, cap wafer, handle wafer) are also vibrating. In some cases, these structures vibrate in phase with and couple to the disc-shaped resonator, resulting in a degradation of the overall sensor performance, with the vibrations manifest as noise and thus compromise the signal-to-noise ratio in the sensor output signal.

Quenching unwanted vibrations of the structures which are not the disc, effectively increases the sensitivity of the transducer which is manifest as an increase in signal to noise ratio (SNR).

Disclosed herein are embodiments of compressive systems comprising relatively rigid materials (force transfer elements) added or deposited in strategic places along any of the edges, faces and corners of a MEMS sensor, followed by the addition of material, which by virtue of the annealing process, applies a compressive stress to all objects encased therein. As a result, vibrational modes are affected due to changes in the effective mass and spring constants of the total MEMS apparatus system, dampening particular modes and stabilizing the MEMS transducer since such modes cannot be spuriously activated due to environmental changes.

FIG. 1 illustrates conceptually a partial top view of a MEMS transducer 10 comprising a substrate 23, MEMS transducer 25, an aperture 17 disposed within the substrate 23, wirebonds 21, solder pads 28, conduits 26 between wirebond pads 22 and solder pads 28 disposed on the surfaces of the substrate 23. In subsequent drawings, the aperture 17, wirebond pads 21, solder pads 28, conduits 26 are not shown for the sake of simplicity, however the reader will understand that such elements would also be implemented similar to the transducer 10 shown in FIG. 1.

Figure 2A:
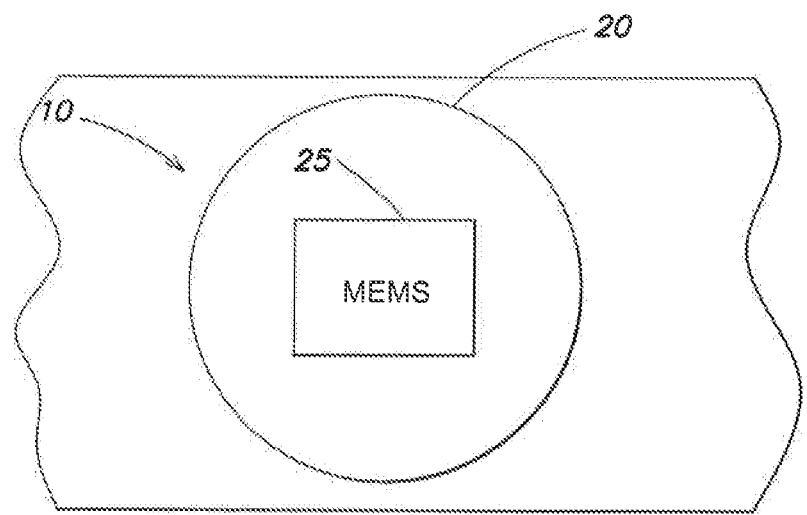
FIG. 2A illustrates conceptually a partial top view of a MEMS transducer in accordance with an embodiment of the present disclosure.
Figure 2B:
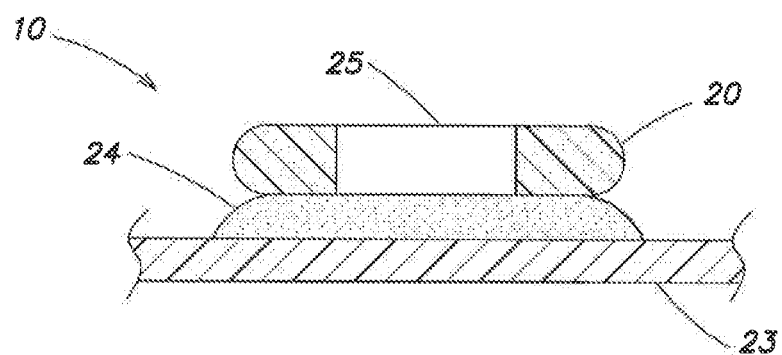
FIG. 2B illustrates conceptually a partial cross-sectional view of the MEMS transducer of FIG. 2A in accordance with an embodiment of the present disclosure.

FIG. 2A illustrates conceptually top view of a MEMS transducer 10, which may be similar to that illustrated in FIG. 1, but which further comprises a compression member 20 in accordance with an embodiment of the present disclosure. FIG. 2B illustrates conceptually a cross-sectional view of the MEMS transducer 10 of FIG. 2A illustrating that the MEMS transducer 10 may be mechanically coupled to a substrate 23 by a soft die attachment layer 24. In FIGS. 2A-B, compression member 20 is not substantially coupled to any other object, thereby mitigating any coupling moments that could cause bending of the MEMS transducer 10.

In one embodiment, compressive member 20 comprises a rigid material and has a substantially annular shape which surrounds the exterior perimeter of the MEMS transducer and provides a compressive stress there about over its respective temperature range, the coefficient of thermal expansion is greater than that of silicon and, therefore, has the effect of counter acting expansion by the MEMS transducer 10. One reason that MEMS transducers are sometimes unstable over their respective operational temperature ranges is because the bending which occurs between the handle and cap wafer that causes different strains and, hence an effective spring constant over temperature. These changes in strains and effective spring constants result in different effective motional impedance which results in changes in various components of the Q that constitute the total Q of the system, as illustrated in Equation 1 below.

$$\frac{1}{Q_r} = \sum_{n=1}^{\infty} \frac{1}{Q_n} \qquad \text{Equation 1}$$

Such nonlinear changes in various components of the Q can be linearized by applying the annular compressive stress then the MEMS system will be more easily controlled over its respective temperature in regards to offset and other relevant parameters that tend to be adversely affected by changes in temperature. Additionally, to distribute the compressive strain provided by compressive member 20 in a manner that is reduced around the corners of the MEMS package and greater in the center or midpoints of the die edge, the embodiments illustrated in FIG. 3A-B are provided.

Figure 3A:
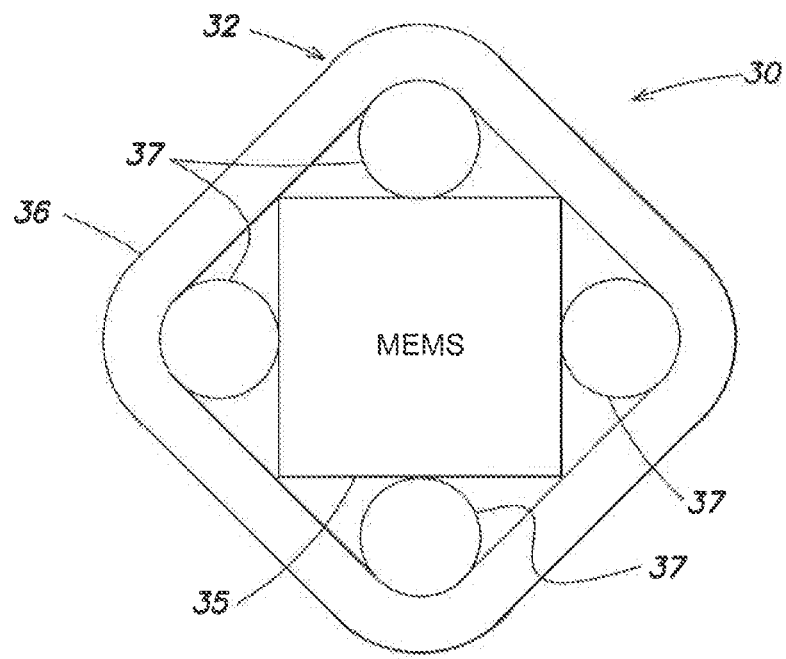
FIG. 3A illustrates conceptually top a partial view of a MEMS transducer in accordance with an embodiment of the present disclosure.
Figure 3B:
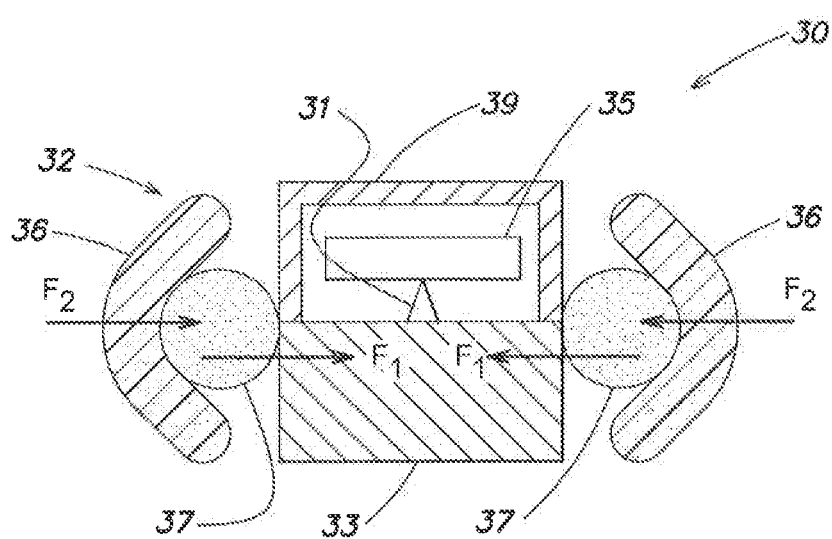
FIG. 3B illustrates conceptually a partial cross-sectional view of the MEMS transducer of FIG. 3A in accordance with an embodiment of the present disclosure.

FIG. 3A illustrates conceptually top view of a MEMS transducer 35 in accordance with an embodiment of the present disclosure while FIG. 3B illustrates conceptually a cross-sectional view of the MEMS transducer of FIG. 3A. FIG. 38 illustrates conceptually a partial cross-sectional view of the packaging of a MEMS apparatus 30. MEMS transducer 35 is balanced on a pedestal 31 above base 33. An enclosure or cap 39 encloses MEMS transducer 35, pedestal 31 and a portion of base 33. A compression system 32 comprising a force distribution element 36 and a plurality of force transfer elements 37 at least partially surrounds one or both of cap 39 and base 33.

In FIGS. 3A-B, force distribution element 36, which may be comprise a rigid or semi-rigid material, forms compressive ring around MEMS transducer 35 and applies compressive force over all relevant temperature ranges of the MEMS transducer 35, e.g. approximately −40° C. to 175° C. The plurality of force transfer elements 37, disposed intermediate force distribution element 36 and MEMS transducer 35 and on opposing exterior surfaces of MEMS transducer 35, transfer compressive force, illustrated as force F2, to force distribution element 36, which, in turn, transfer compressive force, illustrated as force F1, to MEMS transducer 35 in a manner defined by their respective shapes and positioning about the exterior surfaces of the MEMS transducer 35. In the embodiment illustrated in FIGS. 3A-B, force transfer elements 37 have a substantially circular cross-sectional profile.

FIG. 3B illustrates the force applied by compressive system 30 through force transfer elements 37 to MEMS transducer 35. The MEMS apparatus compressive system in FIGS. 3A-B has well-defined boundary conditions over its operational temperature range and, thus, results in stabilizing of the MEMS transducer. Such configuration causes a change in the effective mass and effective spring constant between the resonating disc within the MEMS transducer and the combination of the MEMS transducer and other packaging. This, in turn, affects components of the Q which may be optimized in a way to minimize instability over temperature changes.

Figure 4:
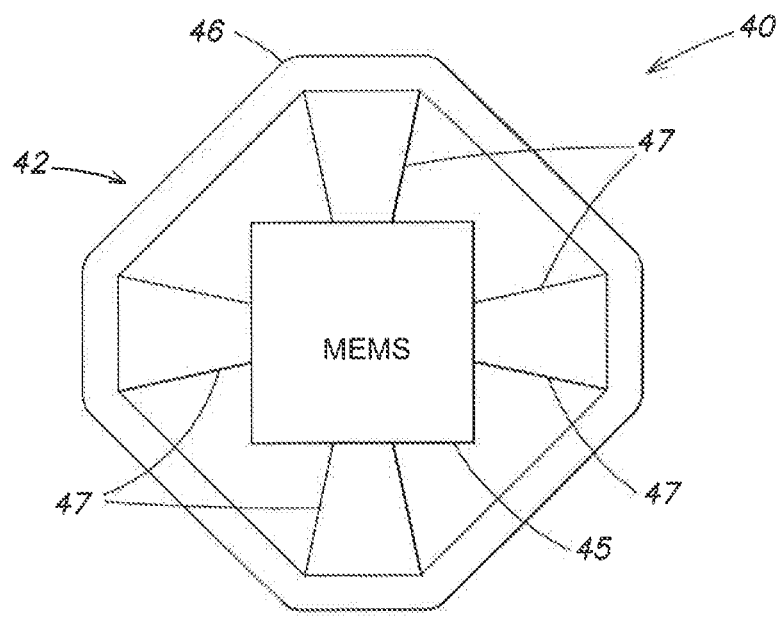
FIG. 4 illustrates conceptually a partial top view of a MEMS transducer in accordance with another embodiment of the present disclosure.
Figure 5:
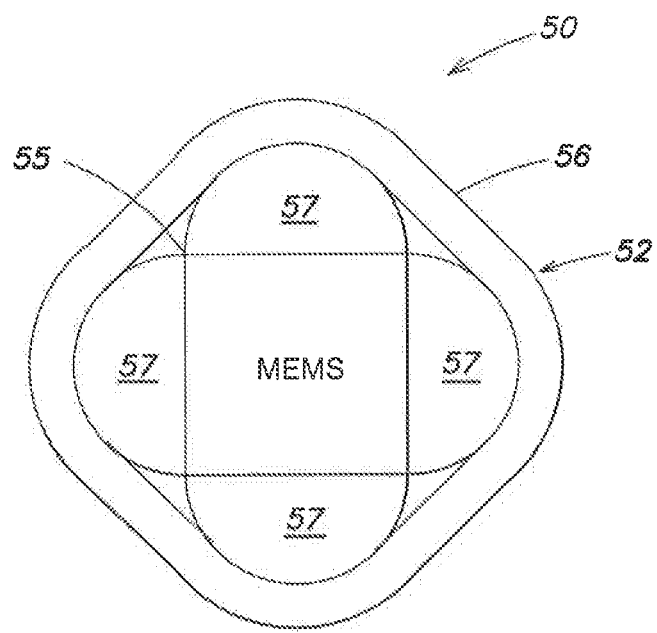
FIG. 5 illustrates conceptually a partial top view of a MEMS transducer in accordance with another embodiment of the present disclosure.
Figure 6:
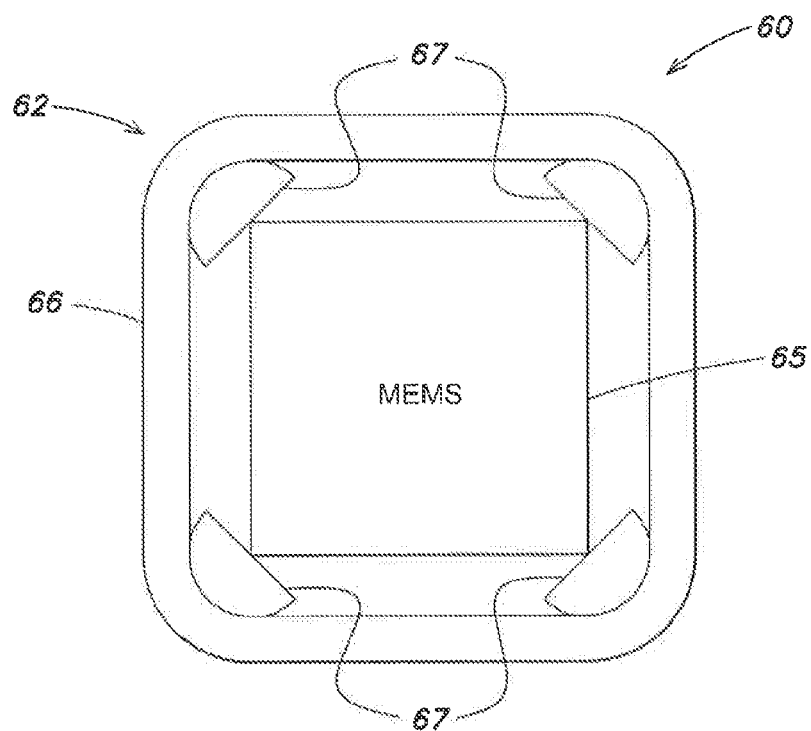
FIG. 6 illustrates conceptually a partial top view of a MEMS transducer in accordance with another embodiment of the present disclosure.

FIGS. 4-6 illustrate conceptually other arrangements and shapes of force transfer elements. In FIG. 4, MEMS apparatus 40 comprises a MEMS transducer 45 surrounded by a compression system 42. Compression system 42 comprises a force distribution element 46 and a plurality of force transfer elements 47. The plurality of force transfer elements 47 have substantially rectangular or trapezoidal cross-sectional areas and are arranged approximately midpoint on opposing exterior surfaces of MEMS transducer 45 and transfer force from force distribution element 46 to MEMS transducer 45.

In FIG. 5, MEMS apparatus 50 comprises a MEMS transducer 55 surrounded by a compression system 52. Compression system 52 comprises a force distribution element 56 and a plurality of force transfer elements 57. The plurality of force transfer elements 57 have substantially semicircular cross-sectional areas and are arranged along the length of opposing exterior surfaces of MEMS transducer 55 and transfer force from force distribution element 56 to MEMS transducer 55.

In FIG. 6, MEMS apparatus 60 comprises a MEMS transducer 65 surrounded by a compression system 62. Compression system 62 comprises a force distribution element 66 and a plurality of force transfer elements 67. The plurality of force transfer elements 67 have substantially semicircular cross-sectional areas, similar to that of elements 57 of FIG. 5, but are arranged, instead, along the corner exterior surfaces of MEMS transducer 65 and transfer force from force distribution element 66 to MEMS transducer 65.

Figure 7:
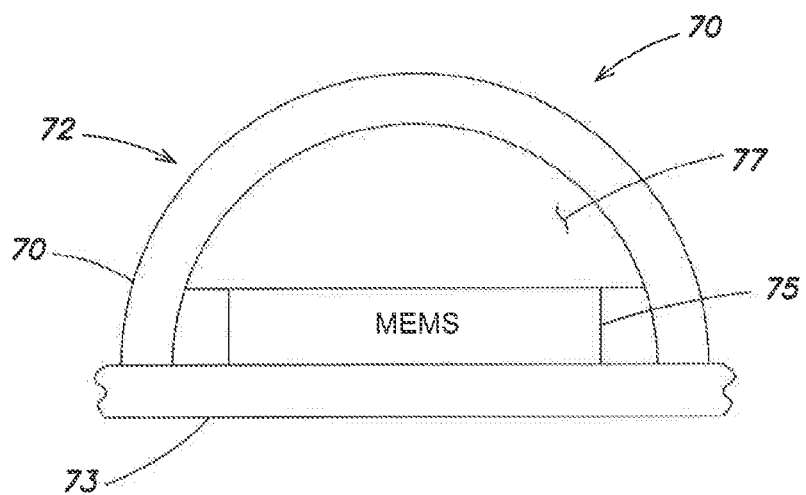
FIG. 7 is illustrates conceptually a partial cross-sectional view of a MEMS transducer in accordance with another embodiment of the present disclosure.

Different MEMS sensors may require compressive forces on different surfaces thereof. FIGS. 7-8 illustrate a MEMS sensor system in which distributed or point forces may be directed to the top and bottom exterior surfaces or only top or only bottom of the sensor package. Specifically, in FIG. 7, MEMS system 70 comprises a MEMS transducer 75 surrounded by a compression system 72. Compression system 72 comprises a force distribution element 76 and a force transfer elements 77. Force distribution element 76 applies compressive force overall temperatures and may be implemented in natural or synthetic resins or ceramic or other suitable materials. In the illustrative embodiment, force distribution element 76 may have a substantially arcuate shape secured to the substrate or the MEMS die, as illustrated, and extending at least partially over the MEMS transducer 75. Force transfer element 77 is disposed adjacent MEMS transducer 75 and may have a curved surface which mimics a complementary surface on force distribution element 76. Force transfer element 77 focuses the forces from force distribution element 76 on to the top or a single exterior surface of MEMS transducer 75 as necessary to stabilize the transducer boundary conditions over a temperature range.

In FIG. 8, MEMS system 80 comprises a MEMS transducer 85 surrounded by a compression member 82. Compression member 82 comprises a compressive member 81, a force distribution element 86 and a plurality of force transfer elements 87. Force distribution element 86 distributes compressive force over all temperatures and may have a curved surface which mimics a complementary surface of compressive 81. In this embodiment, a plurality of force transfer elements 87 are disposed on opposing exterior surfaces of MEMS transducer 85 and may have a substantially circular cross-sectional shape. Force transfer elements 87 focus the forces from force distribution element 86 on to MEMS transducer 85 as necessary to stabilize the transducer boundary conditions over a temperature range. In the MEMS system 80 of FIG. 8, compression member 82 focuses force on opposing exterior surfaces, in this case the top and bottom external surfaces, of MEMS system 80. As illustrated in FIG. 8, the force transfer elements 87 beneath MEMS system 80 are incorporated into the die attachment material 84 or maybe pre-deposited on the relevant exterior surface of MEMS system 80. Compressive member 81 may comprise natural or synthetic resins, glass, metal or semiconductor materials.

In one embodiment, force transfer elements 87 may be implemented with an electrically conductive material such as gold spheres or other materials or shapes which could also serve as electrical conduits from the substrate to the MEMS transducer 85.

FIGS. 9-11 illustrate a MEMS sensor system in which a compressive structure is disposed on a top surface of the MEMS transducer. In FIGS. 10-11 one or more force transfer elements are disposed adjacent a bottom surface of the MEMS transducer. Specifically, in FIGS. 9A-B a MEMS system 90 comprises a MEMS transducer 95 disposed adjacent a substrate 93. Compression member 92 is disposed on a top surface of the MEMS transducer 95 and has a generally circular or ring shape that distributes compressive force over all temperatures to the top surface of the MEMS transducer 95.

In FIGS. 10A-B a MEMS system 100 comprises a MEMS transducer 105 disposed adjacent a substrate 103. Compression member 102 is disposed on a top surface of the MEMS transducer 105 and may have any of an "X", a cross, or customized shape that distributes compressive force over a range of temperatures to the top surface of the MEMS transducer 105. A force transfer element 107 is disposed intermediate MEMS transducer 105 and substrate 103 and directs counterforce upward to the underside MEMS transducer 105, as illustrated.

In FIGS. 11A-B a MEMS system 110 comprises a MEMS transducer 115 disposed adjacent a substrate 113. Compression member 112 is disposed on a top surface of the MEMS transducer 115 and may have a generally rectangular shape that distributes compressive force over all temperatures to the top surface of the MEMS transducer 115. A force transfer element 117 is disposed intermediate MEMS transducer 115 and substrate 113 and directs counterforce upward to the underside MEMS transducer 115, as illustrated. In addition, a lid is disposed intermediate compression member 112 and MEMS transducer 115, with a second plurality of force transfer elements 117 disposed intermediate the lid and the MEMS transducer 115.

The material from which any of the compressive members 92, 102 and 112 may vary for custom applications to achieve the balance in force necessary for heat transfer across a temperature range and to allow the MEMS transducer to perform at its intended design parameters.

Any of the members of the compressive systems of the embodiments described herein, including the force distribution elements or force transfer elements, may comprise relatively rigid materials. Typically, the force transfer elements are either are added or deposited in strategic places along any of the edges, faces and corners of a MEMS transducer package, followed by the addition of a rigid material either through injection molding or material deposition processes, which by virtue of the annealing process, applies a compressive stress to all objects encased therein. The rigid materials from which the one or more compressive system elements are constructed may have a coefficient of expansion which is greater at higher temperatures so that the amount of compressive force directed inward towards the MEMS transducer increases as the operational temperature of the MEMS transducer itself increases.

The method of manufacturing a microelectromechanical (MEMS) transducer in accordance with this disclosure comprises disposing a MEMS transducer having a plurality of exterior surfaces on a substrate and constructing a compressive structure adjacent to and mechanically coupled with at least one of the plurality of exterior surfaces of the MEMS transducer. All or part of the compressive structure may be formed by either an injection molding or material deposition process from materials having a higher coefficient of expansion at higher temperatures, or, a higher modulus of elasticity at higher temperatures. Materials suitable for use in one or more components of the compressive system include injection molding compounds, such as the KE-G1250LKDS and related KE-G1250 series products, commercially available from KYOCERA Chemical Corporation, Kawaguchi City, Saitama, JAPAN; the Nitta GE-100LFCS series products, commercially available from General Electric Corporation, Fairfield, Conn.: and CEL-9220ZHF10 and related 9200 series epoxy molding compounds, commercially available from Hitachi Chemical Co., Ltd., Tokyo, Japan. Other materials suitable for use in one or more components of the compressive system include encapsulants, such as Sylgard® 160 Silicone, Sylgard® 164 Silicone, Sylgard® 170 Silicone, Sylgard® 184 Silicone, and Sylgard® 186 Silicone, all commercially available from DOW Corning Silicones, Parc Industriel de Seneffe 1, 7180 Seneffe, Belgium. Other similar or different nonlinear materials may likewise be utilized to achieve the same results described herein.

In embodiments where the compressive structure comprises both a force distribution element and a force transfer element, the force transfer element may be constructed or disposed adjacent one or more of the plurality of exterior surfaces of the MEMS transducer prior to construction of or encasement of the MEMS transducer by the force distribution element. In operation, is the operational temperature of the MEMS apparatus increases so will that of the compressive structure, which due to its increased coefficient of expansion at higher temperatures, will direct greater compressive forces inward towards the MEMS transducer in a manner directed by the shape and placement of the elements of the compressive system, particularly where force transfer elements are used on opposing exterior sides of the MEMS transducer package.

The reader will appreciate that the multiple apparatus and methods disclosed herein enable the creation of a stable MEMS product that has good immunity to external stresses, strains, vibrations and thermal transients.

It will be obvious to those recently skilled in the art that modifications to the apparatus and process disclosed here in may occur, including substitution of various component values or nodes of connection, without parting from the true spirit and scope of the disclosure.

What is claimed is:

1. A microelectromechanical (MEMS) apparatus comprising:
   a MEMS transducer having a plurality of exterior surfaces; and
   a compressive system mechanically coupled to at least one of the plurality of exterior surfaces of the MEMS transducer and configured for applying compressive strain to at least one of the plurality of exterior surfaces over an operational temperature range of the MEMS transducer.

2. The MEMS apparatus of claim 1 wherein the compressive system comprises a force distribution element applying compressive force to at least one of the plurality of exterior surfaces.

3. The MEMS apparatus of claim 2 wherein the compressive system further comprises a force transfer element disposed intermediate the force distribution element and the at least one of the plurality of exterior surfaces of the MEMS transducer.

4. The MEMS apparatus of claim 3 further comprising a plurality of force transfer elements disposed intermediate the force distribution element and multiple of the plurality of exterior surfaces of the MEMS transducer.

5. The MEMS apparatus of claim 4 wherein each of the plurality of force transfer elements applies compressive force to different of the plurality of exterior surfaces of the MEMS transducer.

6. The MEMS apparatus of claim 2 wherein the plurality of exterior surfaces define an exterior perimeter of the MEMS transducer and wherein the force distribution element at least partially surrounds the exterior perimeter.

7. The MEMS apparatus of claim 2 wherein the force distribution element comprises a rigid material.

8. MEMS apparatus of claim 7 wherein the force distribution element comprises a rigid material having a higher coefficient of expansion at higher temperatures.

9. The MEMS apparatus of claim 3 wherein the force transfer element comprises a rigid material.

10. MEMS apparatus of claim 3 wherein the force transfer element comprises a rigid material having a higher coefficient of expansion at higher temperatures.

11. The MEMS apparatus of claim 5 wherein pairs of the plurality of transfer elements are disposed on opposing of the plurality of exterior surfaces.

12. The MEMS apparatus of claim 1 wherein the MEMS transducer is disposed upon a substrate.

13. The MEMS apparatus of claim 11 wherein the compressive system further comprises a force transfer element disposed intermediate the MEMS transducer and the substrate.

14. The MEMS apparatus of claim 12 wherein the compressive system further comprises a force distribution element disposed on one of the plurality of exterior surfaces of the MEMS transducer opposite the force transfer element.

15. The MEMS apparatus of claim 12 wherein the force transfer element comprises an electrically conductive material.

16. A method of operating a microelectromechanical (MEMS) transducer comprising:
   A) providing a MEMS transducer having a plurality of exterior surfaces; and
   B) applying compressive stress to at least one of the plurality of exterior surfaces of the MEMS transducer over an operational temperature range of the MEMS transducer.

17. The method of claim 16 wherein B) comprises:
   B1) applying compressive force to multiple of the plurality of exterior surfaces of the MEMS transducer.

18. The method of claim 17 wherein B1) comprises applying compressive force to opposing of the plurality of exterior surfaces of the MEMS transducer.

19. The method of claim 16 wherein B) comprises:
   B1) applying greater compressive force to at least one of the plurality of exterior surfaces of the MEMS transducer when the MEMS transducer is operating at a higher temperature.

20. The method of claim 19 wherein B1) comprises applying compressive force to at least one of the plurality of exterior surfaces of the MEMS transducer through a compressive structure mechanically coupled to the MEMS transducer.

21. The method of claim 20 wherein at least a portion of the compressive structure comprises a rigid material having a higher coefficient of expansion at higher temperatures.

22. A microelectromechanical (MEMS) apparatus comprising:
   a MEMS transducer having plurality of exterior surfaces;
   a compressive system applying compressive strain to opposing of the plurality of exterior surfaces.

23. The microelectromechanical (MEMS) apparatus of claim 22 wherein the plurality of exterior surfaces define an exterior perimeter of the MEMS transducer and wherein the compressive system at least partially surrounds the exterior perimeter.

24. A method of manufacturing a microelectromechanical (MEMS) transducer comprising:
   A) disposing a MEMS transducer having a plurality of exterior surfaces on a substrate; and
   B) constructing a compressive structure adjacent to and mechanically coupled with at least one of the plurality of exterior surfaces of the MEMS transducer, the compressive structure applying compressive strain to at least one of the plurality of exterior surfaces of the MEMS transducer over an operational temperature range of the MEMS transducer.

25. The method of claim 24 wherein B) comprises:
   B1) constructing the compressive structure from a rigid material having a higher coefficient of expansion at higher temperatures.

26. The method of claim 24 wherein B) comprises:
   B1) constructing a force distribution element from a rigid material having a higher coefficient of expansion at higher temperatures.

27. The method of claim 26 wherein B) further comprises:
   B2) constructing a force transfer element intermediate the force distribution element and the at least one of the plurality of exterior surfaces of the MEM.

28. The method of claim 24 wherein B) comprises:
   B1) constructing the compressive structure by an injection molding process.

29. The method of claim 24 wherein B) comprises:
   B1) constructing the compressive structure by a material deposition process.

* * * * *